United States Patent [19]
Schulz

[11] 3,961,243
[45] June 1, 1976

[54] INDUCTIVE DISPLACEMENT TRANSDUCER USING A BRIDGE CIRCUIT HAVING A STABLE VOLTAGE PHASE IN THE DIAGONAL OF THE BRIDGE

[75] Inventor: Winfried Schulz, Berlin, Germany

[73] Assignee: Siemens Aktiengesellschaft, Munich, Germany

[22] Filed: May 17, 1974

[21] Appl. No.: 470,904

[30] Foreign Application Priority Data
May 21, 1973 Germany............................ 2326257

[52] U.S. Cl.............................. 324/34 D; 336/118; 336/130; 336/136; 340/199
[51] Int. Cl.² ........................................ G01R 33/00
[58] Field of Search ............ 324/34 R, 34 D, 34 PS; 340/195, 196, 199; 336/45, 118, 130, 136

[56] References Cited
UNITED STATES PATENTS

| | | | |
|---|---|---|---|
| 2,363,690 | 11/1944 | Razek................................ | 340/199 |
| 2,794,971 | 6/1957 | Hornfeck............................ | 340/196 |
| 3,688,187 | 8/1972 | Loos................................ | 324/34 PS |

*Primary Examiner*—Robert J. Corcoran
*Attorney, Agent, or Firm*—Kenyon & Kenyon Reilly Carr & Chapin

[57] ABSTRACT

An inductive displacement transducer comprising a current measuring bridge circuit including a pair of adjustable electrical resistors coupled in series relationship in one half thereof, and a pair of series coupled induction coils and a movable magnetic armature in the other half of the bridge circuit. Each induction coil has the same inductance L when the armature is positioned symmetrically with respect to the coils, and the ohmic resistance $R_s$ of each bridge circuit branch which includes an induction coil is the same. The improvement of the invention comprises the provision of a pair of series coupled electrical shunt resistors, each coupled to one of the induction coils, having an electrical resistance $R_p$ which is determined by the equation $R_p = W^2 L^2 / R_s$ where WL is chosen so as to be substantially greater than $R_s$. Alternatively, an electrically conductive tube may be disposed within the induction coils which has eddy current losses corresponding to the ohmic losses of the shunt resistors.

3 Claims, 4 Drawing Figures

INDUCTIVE DISPLACEMENT TRANSDUCER USING A BRIDGE CIRCUIT HAVING A STABLE VOLTAGE PHASE IN THE DIAGONAL OF THE BRIDGE

BACKGROUND OF THE INVENTION

The invention relates to an inductive displacement transducer which comprises a measuring bridge for measuring an a-c current having an angular frequency W, and which includes in one half thereof a pair of series coupled adjustable resistors, and in the other half a pair of induction coils having substantially identical dimensions and electrical characteristics and a movable magnetic armature common to both coils. In the symmetrical, balanced position of the magnetic armature, each coil has the same inductance L; each branch of the circuit including a coils also has the same ohmic resistance $R_s$. In inductive displacement transducers of this type, the movement of the magnetic armature with respect to the induction coils is converted into a voltage which is proportional to the armature displacement, which voltage is measured in the diagonal of the bridge circuit. The pair of adjustable resistors serve to enable balancing of the bridge when the position of the magnetic armature is symmetrical relative to both coils.

Inductive displacement transducers are described in Handbook of Electrical Measurement of Mechanical Quantities by C. Rohrbach, VDI-Verlag, Duesseldorf, 1967. Section 4.4 of this reference discloses a transversal-armature transducer which consists of a bridge branch having a pair of identical coaxial coils, each of which is disposed about a leg of a pair of oppositely disposed, U-shaped magnetic cores. The magnetic armature of the transducer is disposed in the air gap between these magnetic cores. Section 4.5 of the reference discloses several different plunger-type armature transducers which include in at least one half of the bridge circuit a pair of either linear or curved coils containing an iron core magnetic armature which is movable either axially or pivotably.

In these known types of inductive displacement transducers, the adjustable resistors are generally shunted by a variable capacitor so that the displacement of the magnetic armature can be additionally determined relative to a position which is not symmetrical to both induction coils. To do this, it is necessary to first balance the phase shift between the applied voltage and the a-c voltage present in the bridge diagonal by means of the capacitor, and then balance the bridge by means of the pair of adjustable resistors. The determination of the linear displacement of the magnetic armature is, thus, quite complicated, since three electrical components must first be adjusted, and then the a-c voltage, which appears in the bridge diagonal and is proportional to the displacement of the magnetic armature, must be measured. Moreover, a phase difference usually exists between the applied a-c voltage and that present in the bridge diagonal in such transducers, this difference being a function of the position of the magnetic armature. In order to achieve accurate measurements, this phase difference must be balanced.

SUMMARY OF THE INVENTION

It is therefore an object of the invention to provide an improved inductive displacement transducer in which the phase of the voltage appearing in the bridge diagonal is always the same as the phase of the voltage applied to the measuring bridge, and in which additional balancing of the phase is not required for large deviations of the position of the magnetic armature from its position which is symmetrical to the induction coils.

These and other objects of the invention are achieved by an inductive displacement transducer which comprises a current measuring bridge for measuring an a-c current of a frequency W. The bridge includes in one half thereof a pair of adjustable electrical resistors coupled in series relationship, and a pair of series coupled electrical induction coils in the other half thereof. These induction coils have the same dimensions and electrical characteristics, and are inductively coupled to a movable magnetic armature. Each coil has the same electrical inductance L when the armature is positioned symmetrically with respect to the coils, and further, each bridge branch including an induction coil has the same ohmic resistance $R_s$. The induction coils and the electrical resistors are coupled to each other in parallel relationship. The improvement of the invention comprises the provision of a pair of series-coupled electrical shunt resistors each coupled in parallel relationship to one of the induction coils. The electrical resistance $R_p$ of each of the shunt resistors is determined by the equation $R_p = W^2L^2/R_s$, where WL is chosen so as to be substantially greater than $R_s$.

In an alternate embodiment of the invention, the shunt resistors are replaced by an electrically conductive tube disposed within the coils, which tube guides the magnetic armature and has eddy current losses which correspond to the ohmic losses in the shunt resistors. The shunt resistors, or the tube if used, are preferably fabricated from material having a low temperature coefficient, so that measurement errors, produced by a rise in the temperature of the shunt resistors or the tube, are avoided. Each bridge branch having an induction coil preferably includes a compensation resistor, coupled in series relationship to the coil, which has a temperature coefficient chosen so that any change in the ohmic resistance of the coil in response to temperature changes is compensated for.

The displacement of the magnetic armature is determined by balancing the measuring bridge by means of the adjustable resistors, and then deducing the displacement from the balanced setting of the resistors. However, it is also possible to determine the displacement of the magnetic armature by measuring the voltage drop across the bridge diagonal. It should be noted that if the induction coils and the magnetic armature are suitably modified, the inductive displacement transducer can also be used to determine an axial or angular armature displacement. These and other features of the inventive transducer will be described in further detail in the following detailed description.

DETAILED DESCRIPTION

Figure 1:
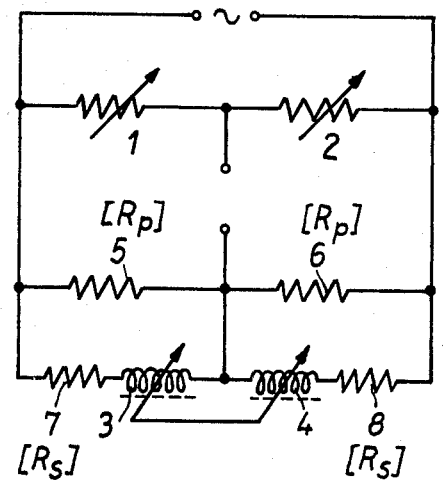
FIG. 1 is a schematic diagram of an improved inductive displacement transducer constructed according to the invention.

Referring now to the drawings, and in particular to FIG. 1, there is shown an a-c current measuring bridge which includes in one half thereof a pair of series coupled adjustable resistors 1 and 2. A pair of series coupled electrical induction coils 3 and 4, and a common, movable magnetic armature, are disposed in the other half of the bridge circuit. The electrical induction coils have the same dimensions and electrical characteristics, and the inductance L of each coil is the same when the armature is positioned symmetrical to both coils. Each of the coils has an ohmic resistance $R_s$ which is shown in its equivalent circuit form on the drawings as resistances 7 and 8 in series with the inductances 3 and 4 as is conventional. A pair of shunt resistors 5 and 6 having an electrical resistance $R_p$ are each coupled in parallel relationship to one of the induction coils.

Figure 2:
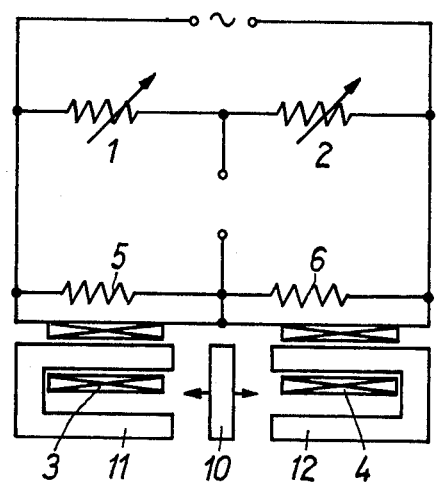
FIG. 2 is a schematic diagram of another embodiment of the transducer which is particularly adapted for use in measuring small armature displacements.
Figure 3:
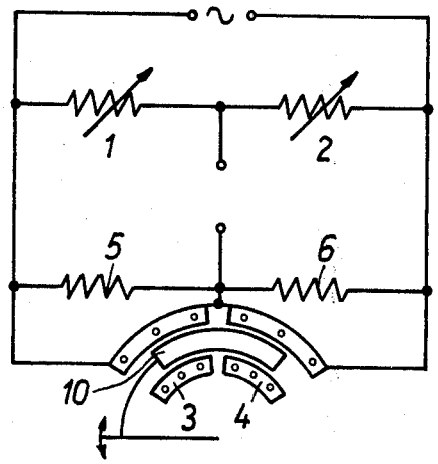
FIG. 3 is a schematic diagram of still another embodiment of the transducer which is particularly adapted for use in measuring angular armature displacements.

In the embodiment of the transducer shown in FIG. 2, the induction coils 3 and 4 are disposed about the legs of a pair of oppositely disposed, U-shaped magnetic cores 11 and 12. The movable magnetic armature 10 is disposed between these magnetic cores. As in the previously described embodiment, a pair of shunt resistors 5 and 6 are parallel coupled to the induction coils. This embodiment is useful for measuring small armature displacements. The embodiment of the invention illustrated in FIG. 3, however, is useful for measuring angular armature displacements. As shown in the drawings, a pair of curved coils 3 and 4 and a curved, rotatable magnetic armature 10, are utilized here.

Figure 4:
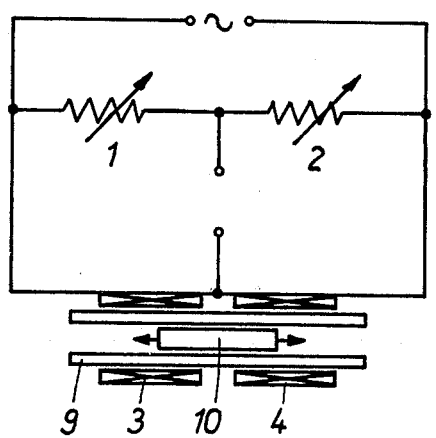
FIG. 4 is a schematic diagram of still a further embodiment of the transducer which is adapted for use in measuring axial armature displacement.

In the transducer embodiment of FIG. 4, which is useful for measuring axial armature displacement, and axially movable magnetic armature 10 is disposed within a pair of coaxial coils 3 and 4. The shunt resistors coupled across the coils of the previously described transducers are replaced here by an electrically conductive tube 9 also disposed within the coils. This tube guides the iron core and has eddy current losses which correspond to the ohmic losses of the shunt resistors. Moreover, the tube serves to separate the space used for voltage measurement from the external environment of the transducer, a feature which is particularly important in pressure measuring transducers. Such an electrically conductive tube can also be used with either two straight or two curved coils and a curved magnetic armature which is angularly displaceable.

When the magnetic armature is displaced from its symmetrical position with respect to the induction coils, the inductance of one coil increases and the inductance of the other coil decreases in approximately an equal amount. Phase equality between the applied a-c voltage and the a-c voltage drop across the bridge diagonal is produced when the reactive component of the ratio of the impedances of the bridge branches including the induction coils is eliminated. Assuming that the square of the change in the inductance of a coil can be ignored with respect to the square of the inductance L of a coil when the magnetic armature is in its position of symmetry, the resistance $R_p$ of each of the shunt resistors, or, alternatively, of the electrically conductive tube, is given by the equation $$R_p = W^2 L^2 / R_s - R_s.$$

If WL is chosen to be substantially greater than $R_s$, $R_p$ is given approximately by the equation $$R_p = W^2 L^2 / R_s$$

For example, if $R_s$ has a value of 200 ohms, the inductance L is 100 mH, and the angular frequency W is chosen sufficiently high, for example, 20 kHz, $R_p$ is given as 20 kohm.

As previously described, the transducer of the invention is operated by first balancing the bridge circuit by adjustment of the adjustable resistors. The displacement of the armature is then determined by reading the settings of the adjustable resistors.

In the foregoing specification, the invention has been described with reference to specific exemplary embodiments thereof. It will, however, be evident, that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In an inductive displacement transducer comprising a current measuring bridge circuit for measuring an a-c current of a frequency W and including in one half of the bridge circuit a pair of adjustable electrical resistors coupled in series relationship, and in the other half of the bridge circuit a pair of series coupled electrical induction coils having the same dimensions and electrical characteristics and a movable magnetic armature inductively coupled to the induction coils, with each of said coils having the same electrical inductance L when the armature is positioned symmetrically with respect to the induction coils, and each bridge circuit branch which includes an induction coil having the same ohmic resistance $R_s$, said induction coils and said electrical resistors being coupled in parallel relationship, the improvement comprising a pair of series coupled electrical shunt resistors each coupled in parallel relationship to one of said induction coils, with the electrical resistance $R_p$ of each of said shunt resistors being determined by the equation $R_p = W^2 L^2 / R_s$, and WL is chosen so as to be substantially greater in value than $R_s$.

2. The transducer as recited in claim 1, wherein said shunt resistors are fabricated from low temperature coefficient material.

3. A method of operating an inductive displacement transducer of the type comprising a current measuring bridge circuit for measuring an a-c current of a frequency W, and including in one half of the bridge circuit a pair of adjustable electrical resistors coupled in series relationship, and in the other half thereof a pair of series coupled electrical induction coils having the same dimensions and electrical characteristics and a movable magnetic armature inductively coupled to the induction coils, with each of the coils having the same electrical inductance L when the armature is positioned symmetrically with respect to said induction coils, and each bridge circuit which includes an induction coil having the same ohmic resistance $R_s$, said induction coils and adjustable resistors being coupled in parallel relationship, and further including a pair of series coupled electrical shunt resistors each coupled in parallel relationship to one of said induction coils having a resistance $R_p$ determined by the relation $R_p =$ $W^2L^2/R_s$, with WL being chosen so as to be substantially greater than $R_s$, said method comprising the steps of balancing said bridge circuit by adjusting the electrical resistance of said adjustable resistors, and determining the displacement of said magnetic armature by reading the setting of said adjustable resistors.

* * * * *